(12) United States Patent
Wiener-Avnear et al.

(10) Patent No.: US 6,798,717 B2
(45) Date of Patent: Sep. 28, 2004

(54) HIGH DENSITY PIXEL ARRAY

(75) Inventors: Eliezer Wiener-Avnear, Carlsbad, CA (US); James Earl McFall, Carlsbad, CA (US)

(73) Assignee: Eli Wiener-Avnear, Carlsbad, CA (US)

( * ) Notice: Subject to any disclaimer, the term of this patent is extended or adjusted under 35 U.S.C. 154(b) by 0 days.

(21) Appl. No.: 10/457,233

(22) Filed: Jun. 9, 2003

(65) Prior Publication Data

US 2004/0114467 A1 Jun. 17, 2004

Related U.S. Application Data

(62) Division of application No. 09/780,059, filed on Feb. 9, 2001, now Pat. No. 6,586,702, which is a continuation-in-part of application No. 09/557,114, filed on Apr. 24, 2000, now abandoned, which is a continuation of application No. 09/275,537, filed on Mar. 24, 1999, now Pat. No. 6,087,618, which is a division of application No. 08/937,552, filed on Sep. 25, 1997, now Pat. No. 5,956,382.

(51) Int. Cl.[7] .............................................. H04R 17/00
(52) U.S. Cl. ...................................................... 367/180
(58) Field of Search ................................ 367/153, 140, 367/180; 29/25.35; 310/334; 438/50

(56) References Cited

U.S. PATENT DOCUMENTS

| 3,900,864 A | | 8/1975 | Dapkus et al. |
| 4,628,573 A | * | 12/1986 | Hamada et al. ............ 29/25.35 |
| 5,438,554 A | * | 8/1995 | Seyed-Bolorforosh et al. ....... 367/153 |
| 5,519,227 A | | 5/1996 | Karellas |
| 6,087,618 A | | 7/2000 | Wiener-Avnear |
| 6,225,728 B1 | * | 5/2001 | Gururaja ..................... 310/334 |

OTHER PUBLICATIONS

"Ultrasonic Transducers and Arrays", K. Kirk Shung and Michael Zipparo, IEEE Engineering in Medicine and Biology, Nov./Dec. 1996, pp. 20–30.

"Design Guidelines for Medical Ultrasonic Arrays", Ronald E. McKeighen, SPIE vol. 3341, pp. 2–4, 1998.

"Characteristics of Relaxor–Based Piezoelectric Single Crystals for Ultrasonic Transducers" Sueung–Eek Park and T.R. Shrout, IEEE Transactions on Ultrasonics, Ferroelectrics and Frequency Control, vol. 44, No. 5, pp. 1140–1147, 1997.

(List continued on next page.)

*Primary Examiner*—Daniel Pihulic
(74) *Attorney, Agent, or Firm*—Gordon & Rees LLP

(57) ABSTRACT

A pixel array device is fabricated by a laser micro-milling method under strict process control conditions. The device has an array of pixels bonded together with an adhesive filling the grooves between adjacent pixels. The array is fabricated by moving a substrate relative to a laser beam of predetermined intensity at a controlled, constant velocity along a predetermined path defining a set of grooves between adjacent pixels so that a predetermined laser flux per unit area is applied to the material, and repeating the movement for a plurality of passes of the laser beam until the grooves are ablated to a desired depth. The substrate is of an ultrasonic transducer material in one example for fabrication of a 2D ultrasonic phase array transducer. A substrate of phosphor material is used to fabricate an X-ray focal plane array detector.

24 Claims, 5 Drawing Sheets

OTHER PUBLICATIONS

"Beam Steering with Linear Arrays", Olaf T. Von Ramm and Stephen W. Smith, IEEE Transactions on Biomedical Engineering, vol. BME–30, No. 8, pp. 438–452, Aug. 1983.

"Two–Dimensional Arrays for Medical Ultrasound", S.W. Smith, G.E. Trahey, and O.T. Von Ramm, Ultrasonic Imaging, 14, 213–233, 1992.

"Progress in Two–Dimensional Arrays for Real Time Volumetric Imaging", E.D. Light, R.E. Davidsen, J.O. Fiering, T.A. Hruschka and S.W. Smith, Ultrasound Imag. 20, 1–15, 1998.

"New Opportunities in Ultrasonic Transducers Emerging from Innovations in Piezoelectric Materials" W.A. Smith, SPIE 1733, pp. 3–26, 1992.

"Ultra High Strain and Piezoelectric Behavior in Relaxor Based Ferroelectrics Single Crystals", S.E. Park and T. R. Shrout, J. Appl. Phys. 82, pp. 1804–1811, 1997.

"Crystal Growth and Ferroelectric Related Properties of $(1-x)$ $Pb(A_{1/3}Nb_{2/3})O_3-x$ $PbTiO_3$ $(A=Zn^{2+}, Mg^{2+})$" Seung–Eek Park et al., ISAF 96, pp. 79–82, 1996.

"Can Relaxor Piezoelectric Materials Outperform PZT?", Y. Yamashita and N. Ichinose, ISAF '96, Proc. $10^{th}$ IEEE International Symposium on Applications of Ferroelectric, East Brunswick, NJ, Aug., pp. 71–77, 1996.

* cited by examiner

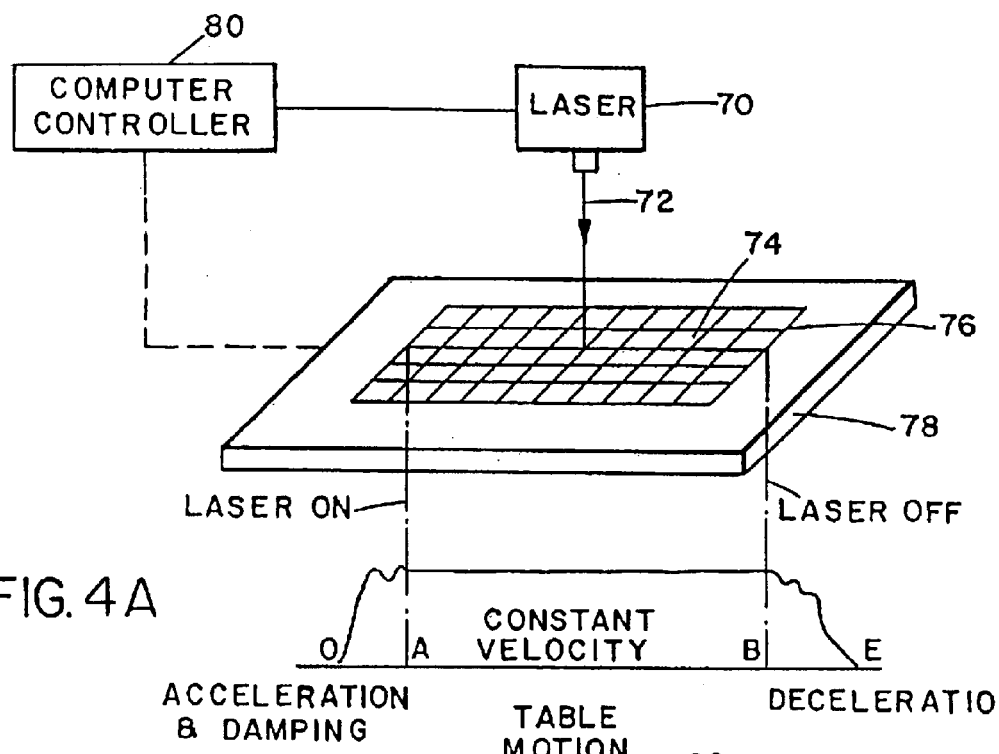
FIG. 4A
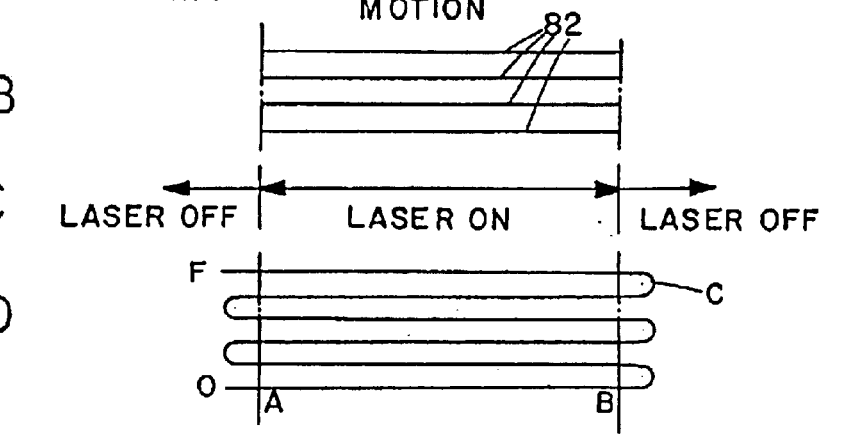
FIG. 4B
FIG. 4C
FIG. 4D
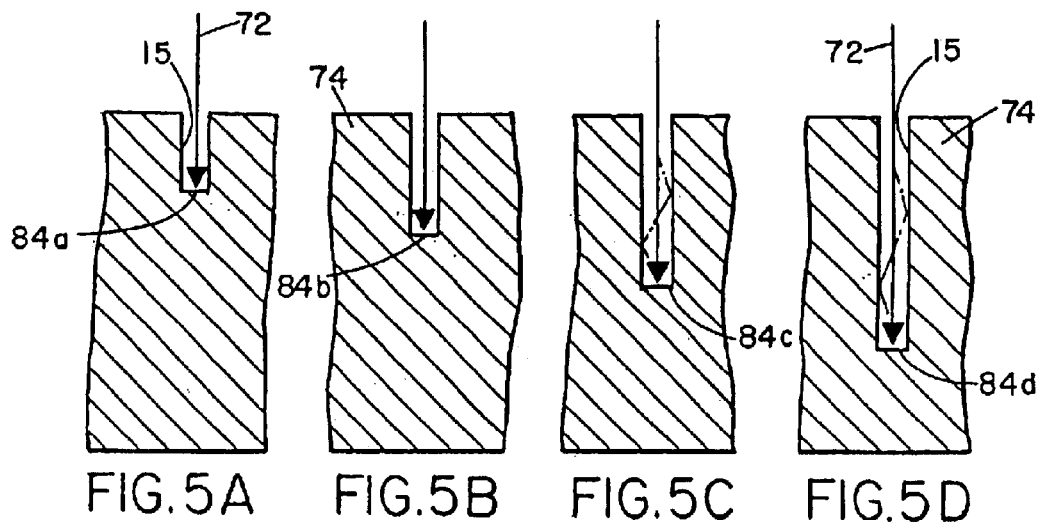
FIG. 5A   FIG. 5B   FIG. 5C   FIG. 5D

HIGH DENSITY PIXEL ARRAY

CROSS-REFERENCE TO RELATED APPLICATIONS

This application is a divisional of application Ser. No. 09/780,059 filed Feb. 9, 2001, now U.S. Pat. No. 6,586,702, which is a Continuation-In-Part of application Ser. No. 09/557,114 filed Apr. 24, 2000, now abandoned, which was a Continuation of application No. 09/275,537 filed on Mar. 24, 1999, now U.S. Pat. No. 6,087,618, which was a division of application No. 08/937,552, filed Sep. 25, 1997, now U.S. Pat. No. 5,956,382.

The U.S. Government has rights in this invention pursuant to contract DAMD17-96-C-6032 awarded by the U.S. Department of Defense and contracts NAS9-00008 and NAS9-00119 awarded by NASA under the Small Business Innovation Research (SBIR) Program.

BACKGROUND OF THE INVENTION

The present invention is generally concerned with high density pixel array systems, such as imagers, sensors, actuators, detectors and the like, and methods of fabricating such arrays, and is particularly concerned with a method of fabricating a high performance pixel array in exotic materials such as ferroelectric, piezoelectric, pyroelectric, acousto-optic materials and the like for integration in such a system.

In imaging systems for medical and other diagnostic sciences, an ongoing goal is the development of a low-cost, high quality, high resolution, real-time digital imaging system for an opaque target, such as the human body. Imaging systems are also used in non-medical applications such as nondestructive testing of materials and compounds. Such systems have the capability of providing on-line, non-invasive imaging. Currently, both X-ray and ultrasonic imaging techniques are used for displaying the internal characteristics of an opaque item, such as parts of human or animal bodies. Both techniques are subject to same disadvantages. In X-ray imaging, digitizing of an X-ray image directly is a challenge because silicon used in the pixels of focal plane digitizing arrays or detectors, such as charge coupled devices (CCDs), is damaged by X-rays. It is known to place a fluorescent or phosphorescent medium between the X-ray source and a visible detector matrix to convert the X-rays to visible light. There are still problems in using a screen of such material in front of the visible matrix detector. For example, if the screen is too thin, not enough of the X-rays will be absorbed and some will reach and damage the visible detector. If the screen is too thick, visible light is scattered, enlarging the area of the detector which is illuminated and reducing the digitized image resolution. In some cases, scattered light may escape without reaching the visible detect or at all. The fluorescent or phosphorescent material may also have non-uniform properties, degrading image quality and resolution. Some phosphorescent materials exhibit "after-glow", in other words they may continue to emit light even after the radiation source is no longer present. This may further degrade the image quality.

U.S. Pat. No. 5,519,227 of Karellas describes a structured scintillation screen which overcomes some of these problems. Regions of a transparent or semi-transparent scintillating substance are ablated to form an array of individual pixels. Each pixel is surrounded with an optically inactive material having a lower refractive index, so that the pixel is made to function as an optical waveguide. This confines the x-ray induced phosphorescence to t he individual pixels and channels it to the corresponding visible detector elements. This increases resolution and detection efficiency. The method of fabrication is as follows: The substrate of phosphorescent or optically active material is exposed to electromagnetic radiation, such as a laser beam, so as to ablate the substrate in exposed regions to produce a one or two dimensional array of pixels. A mask may be placed in contact with the substrate so that the desired regions are ablated by the laser beam. Following laser processing to form the pixels, the pixels are surrounded by an optically inactive interstitial material so as to avoid optical leakage from each pixel. The pixel structure is attached via a substrate to a visible detector such as a CCD camera.

t Other X-ray focal plane array (XFPA) medical matrix imagers have also been proposed, and have been introduced commercially in recent years, particularly for dental examinations. However, these imagers have, up to now, been very expensive and demonstrate marginal performance, due to the significant challenges in developing of a high performance, two dimensional XFPA detection matrix. One of the problems is that in order to replace high-resolution film radiography, the pixelated detector must have high uniformity and almost zero defects, with a resolution approaching 20 lp/mm, for good performance. All current commercial XFPA systems have demonstrated inferior imaging quality as compared with state-of-the-art commercial X-ray films, due to lack of sufficient resolution and low signal/noise.

A different imaging technique is ultrasound imaging, which has many applications. Such non-invasive ultrasonic imaging has advanced tremendously since its inception around 1950 and is currently one of the effective techniques for medical diagnostics of the internal human abdominal organs, the heart and great vessels. The transducer is the heart of all the medical ultrasound imagers. It performs the conversion of the electric signal into acoustic energy (transceiver) and, vice versa, translates back the received mechanical energy into an electric signal (receiver), to detect the information carried in the receiving signal. Consequently, there are fundamental relationships between the architecture and functional operation of the transducer and the quality of the resulting sonographic image.

Early transducers were based on a single element which was manually scanned. In the seventies, the linear phase-array transducers were introduced which were able to electronically focus and electronically steer the ultrasound beam in the plane of the linear array, by the application of suitable phase delays to each element. Current state-of-the-art clinical ultrasound imagers typically use linear phase-arrays (N×1) with more than N=100 elements, to electronically steer and focus the ultrasound beam. These ultrasound imagers are normally scanned in the B mode, which allows viewing of a cross-section slice. However, these arrays can only steer and focus in their elevation direction. Thus, in most cases, the lateral resolution in the azimuth direction can be completely different than in the elevation direction. This asymmetry of the ultrasound beam shape can make the detection of small cysts and lesions in the abdomen, fetus, or myocardium very difficult. In order to reduce the slice thickness and improve the elevation resolution, 1.5D phase-arrays, with (N×3, or (N×5) matrixes were recently implemented in certain ultrasound imaging systems. Currently, most advanced ultrasound imagers used for gynecology, obstetrics, encephalogy, opthamology and cardiology, are based on 1D, or 1.5D, electronic scanned B-mode phase-array transducers, which consist of one or a few rows of piezoelectric transducer elements, respectively. Full volume scanning is usually provided by mechanical scanning of the phase-array transducers either manually, or by a mechanical manipulator.

The most popular ultrasound body imaging is provided by the impulse-echo modality, in which the piezoelectric transducers act as both acoustic sources and detectors of the ultrasound radiation. The principle of the impulse-echo method is based on the ultrasonic transducer transmitting the sound impulse into the body (transceiver). The returning signal from the internal organ is detected by the transducer (receiver), which also determines the time lapse between the transmitted and received pulse, for the determination of the distance of the reflecting (scattering) organ. The further the organ from the origin, the longer is the time measured. Practically, in the impulse-echo method, the echo signals measure the changes in the reflected and scattered ultrasonic radiation, due to the acoustic-impedance differences at the borders between the various biological materials of the different tissues, to generate a mapping image, point by point. Consequently, the impulse-echo methodology is mostly utilized for non-invasive clinical imagery of soft internal tissues, which allows better penetration of these acoustic waves and their back return.

In the last 20 years, the image quality of medical ultrasound imaging has advanced sufficiently to make it an important, and sometimes indispensable, diagnostics modality in obstetrics and in the management of a large number of diseases. Nevertheless, current ultrasound imaging still suffers from a number of disadvantages, which are related to the marginal spatial resolution (blurred images), high noise components (noisy images) and manual operation (bulky scanners). This is also manifested in the subjectivity of the current ultrasound examinations, depending on the experience of the diagnostician to manipulate the ultrasound transducer and interpret the data. It is believed that, up to now, the full potential of ultrasound imagers has not yet been realized for real-time reliable clinical imaging for internal medicine. Nevertheless, although demonstrating only medium spatial resolution, with sometimes only fuzzy images, non-invasive ultrasound medical diagnostic modality is becoming more and more popular as compared with X-ray imaging. This is mostly due to the fact that this cost-effective ultrasound imaging modality does not involve ionizing radiation, while being safe and painless for the patient. The realization of the full potential of the ultrasound medical imaging modality will require a combination of advancements in the transducer architecture, together with improvements in its operating electronics design, its operating performance and in the computational post-processing (acquisition, reconstruction and rendering) of the data, to provide real-time, reliable, high-quality imaging of the targeted internal organs.

Currently, ultrasound is a very popular medical imaging modality, second only to conventional X-rays in the number of procedures performed. Its advantages over the other modalities, including conventional X-rays, computed tomography (CT) and magnetic resonance imaging (MRI), are that it is almost completely noninvasive, providing better soft-tissue differentiation than X-rays, capable of providing images in real-time, it is portable, and perhaps most important in todays environment of curtailing health-care costs, it is very cost-effective. However, even the most advanced ultrasound imaging devices today demonstrate only medium spatial resolution and limited signal-to-noise ratio to allow only a blurry view of internal human vessels. Additionally, current ultrasound imagers require mechanical maneuvering to obtain a volumetric 3D imager. In addition to medical imaging, ultrasound and other types of radiation are commonly used in therapeutic applications to the human or animal body. High intensity, focused ultrasound radiation beams are utilized to burn cancer cells, for example, by focusing the beam to the location of the malignancy.

At present, typical medical sonographic applications are related to the diagnostics in the following: internal medicine (liver, gall bladder and gall vessels, the pancreas, the spleen, the kidneys, the bladder and certain large blood vessels), gynecology, obstetrics, cardiology, opthamology and ultrasound guided aspiration. Typical non-medical sonographic applications are related to Nondestructive Evaluation (NDE), or Nondestructive Testing (NDT) of materials, especially avionic components, for detecting internal defects and/or materials fatigue.

A major step toward realizing improved ultrasound imaging and application is the engagement of two dimensional (2D) phase-array transducers for the impulse-echo operation, as described for example, in "Progress in Two Dimensional Arrays for Real Time Volumetric Imaging" by E. D. Light et al., Ultrasonic Imaging, 20, 1–15, 1998. Indeed, rectangular two dimensional phase-array transducers, which consist of a full matrix of pixels, are now emerging in R&D laboratories with a matrix of elements from 10×10 to 64×64. True 2D ultrasonic transducer phase-arrays are necessary for the following: improving the focus depth resolution, achieving completely electronic tuned high speed volumetric scanning and obtaining angle independent flow imaging without significant aberrations. Consequently, the introduction of the second dimension of the transducer allows elevation steering and dynamic focusing, as well as the use of phase aberration correction algorithms to reduce the B-scan slice thickness, thus achieving better volumetric imaging resolution. These 2D phase-array configurations must be carefully designed to achieve high medical imaging performance, while guaranteeing effective total manufacturability, including the array fabrication, the electronic integration and the compact packaging in a cost-effective manner.

Several 2D phase-array transducer architectures are currently being developed for medical diagnostics of critical lumens in the human body. For example, a square 2D transducer array operating at 5 MHz was developed to improve cardiac images, as the ultrasound beam can be electronically steered and dynamically focused to provide real-time three-dimensional monitoring. The electronic scanning of the ultrasound beam in a pyramidal pattern can display any desired plan sector, including the true short axis of the heart. Such medical transthorcic imaging of the heart has its challenges, as the acoustic window between the ribs limits the transducer footprint. This requires high-density arrays, due to the large number of miniature pixels necessary for shaping and transmitting the ultrasound beam and for the receiving of the echo. Additionally, due to the relatively large distance of the interesting location of the heart (>70 mm) from the external monitor, the attenuation of the body tissue plays a significant role, limiting the use of frequencies higher than 5 MHz as the absorption of the acoustic waves increases substantially at higher frequencies. This imposes certain restrictions on the maximum spatial resolution that the imager can resolve, due to the ultrasound waves diffraction laws. The intraluminal ultrasound device is an alternative to approach the desired lumen or area of the body more closely, thus avoiding the previous mentioned challenges. However, there are problems in introducing such a device into a human body, one of which is the very small dimensions required.

The manufacturing of very large numbers of such miniature transducer elements of the (N×M) 2D phase-array matrix, concentrated in a small volume, provides an extreme challenge in engineering of the device and it's manufacturing costs. Current reticulation techniques involve the use of high precision mechanical saws, as used in the semiconductor industry for dicing integrated circuit wafers. The blades of these saws are too wide to manufacture small pixels. Additionally, the high speed blades may cause cracks or chips in the pixels, and only low aspect ratio cuts can be achieved, since the saws cannot achieve sufficient groove depth to maintain the proper transducer modes of vibration. Chemical photo lithographic etching techniques are also generally unsuitable for etching of piezoelectric materials due to their inert chemical nature. Many other exotic materials like ferroelectrics, piezorestrictive, scintillator, phosphorous and fluorescent materials, which can serve as pixilated matrixes, will encounter the same challenges.

All these challenges have limited the current 2D phase-array transducers and therapeutic transmitters to matrixes with a small number of pixels, operating at low frequencies (<2 MHz). For example, a conventional linear (1D) phase-array medical transducer, consisting of 64 operating elements, with the proper pixel size for 5 MHz operation, will require interelement spacing less than 0.15 mm. To make similar quality images in a fully-sampled 2D phase-array transducer, will require 64×64=4096 elements in an area of close to 9.6×9.6 mm$^2$. The fabrication of such a matrix of tiny elements with high aspect-radio dimensions is very difficult, and the current mechanical dicing Integrated Circuit technique to delineate common piezoelectric materials, fails to guarantee the integrity of the individual pixels.

SUMMARY OF THE INVENTION

It is an object of the present invention to provide a new and improved pixel array and method of fabricating such an array.

According to one aspect of the present invention, a method for micromilling a substrate to a predetermined depth is provided, which comprises the steps of directing a laser beam at a predetermined intensity at a surface of the substrate material, moving the substrate material relative to the laser beam at a constant velocity along a predetermined set of paths so as to remove the surface of the substrate material along the paths by application of a predetermined uniform flux per unit area, and repeating the relative movement of the substrate material and laser beam until the material has been ablated to the predetermined depth to form a series of grooves in a predetermined pattern, the grooves together defining a predetermined array of pixels separated by grooves.

The substrate material may be an X-ray fluorescent material selected from a group consisting of $CdWO_4$, $Bi_4Ge_3O_{12}$, YAG:Eu$^{+3}$, YAG:Ce, CSI(Tl), CSI(Na), CSI, NaI, CsF, CaF(Eu), LiI(Eu), and $Gd_2SiO_5Ce$ where an X-ray imaging detector is to be formed. In an alternative embodiment, the substrate material is an ultrasonic transducer material, such as a relaxor ferroelectric material, a piezoelectric or piezorestrictive, single crystal, or a piezoelectric ceramic. The relaxor ferroelectric single crystal material may be selected from the group consisting of (1-y) [Pb(Zn$_{1/3}$Nb$_{2/3}$)O$_3$]+yPbTiO$_3$ abbreviated PZN-PT, and (1-y) Pb(Mg$_{1/3}$Nb$_{2/3}$)O$_3$+yPbTiO$_3$ abbreviated PMN-PT, and other similar single crystals homologs, which demonstrate super high electromechanical coefficients (strain>1%) and excellent coupling factors (>85%), such as those described in the article "Can Relaxor Piezoelectric Materials Outperform PZT?", by Y. Yamashita et al., ISAF 1996, Proc 10$^{th}$ IEEE International Symposium on Applications of Ferroelectrics, East Brunswick, N.J., August 1996, pp. 71–77. Suitable single crystal piezoelectrics and piezorestrictors may be selected from the group consisting of Barium Titanate, BaTiO$_3$, lithium tantalate, LiTaO$_3$, and similar piezoelectric single crystals with high electromechanical coefficients. Suitable piezoelectric ceramics may have regular grain size (1 μm to 25 μm) or fine grain size, with good transducer characteristics. Suitable piezoelectric ceramic materials include materials based on different compositions of PZT (lead zirconate titanate, or (Pb[Zr,Ti]O$_3$)), which are commercially available from various companies.

In an exemplary embodiment of the invention, the focus and intensity of the laser beam is varied as the depth of the ablated groove increases, in a manner to keep the energy introduced into the micro-milled material at a constant flux per unit area, or energy per unit time per unit area. This helps to ensure that a relatively smooth-sided groove is produced, and also that the adjacent material is not degraded or damaged by introduction of too much heat. The flux per unit area to be applied, in other words the power passing into the surface, is precisely determined depending on the melting point, opacity, and other critical properties of the material so that just enough energy is applied to ablate the material in the desired region without spreading outwardly from that region and potentially degrading adjacent pixels. The power or flux per unit area is controlled by means of the selected constant relative velocity, the laser beam intensity, and the laser focus. All of these may be adjusted to achieve the predetermined flux per unit area.

The grooves may be micro-milled in the substrate material in a rectangular x-y grid pattern, or in a curved or circular array pattern, forming a transducer array of cylindrical shape or round-cross-section. A circular array is particularly suitable for fitting into a catheter for approaching an organ within the body. The grooves separating the pixels are filled with glue material. The glue or adhesive material may be a material which is substantially reflective to visible light, in the case of an X-ray imaging array so as to optically isolate each pixel from adjacent pixels. The resultant pixelated substrate may be attached to a visible pixelated detector, such as a CCD (charge coupled device) detector or other visual matrix detector. In this way, x-rays incident on the pixel array of fluorescent or phosphorescent material will be converted to light rays, and these will be transmitted along each pixel to the underlying corresponding visible detecting pixel.

In the case of an ultrasonic transducer or transmitter array, the adhesive filling the grooves is of a flexible epoxy material. The pixel array may be covered with a matching layer for acoustic matching with the analyzed medium. Each pixel will have a suitable electrode secured at it's lower end for connection of the pixels to supply (transceiver) and readout (receiver) electronics. Additional backing material may be provided to direct the acoustic energy toward the studied medium for energy effectiveness.

The laser micro-milling technique, in which the laser travels at constant velocity along each groove numerous times with a constant or controlled intensity to ensure uniform flux application per unit area gradually ablating the material to a greater and greater depth along each groove, ensures that the groove walls will be relatively smooth and uniform. Control of the laser focus and intensity helps to ensure smoothness of the walls. This technique enables micromilling of materials to form pixelated arrays of much smaller dimensions than was previously possible, without damaging the crystal material within the pixel due to laser thermal effects.

Preferably, the laser in the micro-milling process is controlled to be switched on only when the relative movement between the laser and target or substrate has reached a constant velocity. Additionally, the laser preferably has a pulsed output, and the first, large pulse ("giant pulse") when the laser is first switched on is "killed" or removed in a conventional manner, to ensure that only uniform intensity laser pulses are impinged on the target. The relative velocity and pulse timing is such that adjacent laser pulses overlap to form a continuous groove along each desired straight or curved line or path.

According to another aspect of the present invention, an imaging array detector is provided, which comprises an array of micromilled, elongated pixels separated by grooves, an adhesive material filling the grooves between adjacent pixels, and each groove having a width in the range of 4 $\mu$m to 25 $\mu$m along its entire length.

In one embodiment of the invention, the detector is an X-ray focal plane imaging detector and the pixels are of an x-ray fluorescent material selected from the group consisting of $CdWO_4$, $Bi_4Ge_3O_{12}$, $YAG:Eu^{+3}$, YAG:Ce, CSI(Tl), CSI (Na), CSI, NaI, CsF, CaF(Eu), LiI(Eu), and $Gd_2SiO_5Ce$. These materials were selected based on their laser micro-milling performance and X-ray detection performance. All of the materials listed above are found to fulfill a great part of the required criteria for effective scintillator material, and to be compatible with the laser micro-milling technique used to manufacture the reticulated array. Other materials with equivalent properties may alternatively be used in other embodiments of the invention.

In another embodiment of the invention, a transceiver and receiver is an ultrasonic imaging transducer, and the pixel phase array is formed from a suitable piezoelectric or piezorestrictive material, with the adhesive material filling the grooves being of a flexible glue material. The array may be rectangular, with straight grooves in x and y directions separating the pixels, or may be of circular or other shapes, with at least some of the grooves being curved The method of this invention allows an array detector or transducer of very small dimensions but with a large number of pixel elements to be fabricated with high aspect ratio grooves having almost no material degradation. This results in a high density pixel array suitable for use as a detector, imager, sensor, beam transmitter, or the like, When used as an imager, the array produces high resolution imaging with excellent imaging quality.

BRIEF DESCRIPTION OF THE DRAWINGS

The present invention will be better understood from the following detailed description of some exemplary embodiments of the invention, taken in conjunction with the accompanying drawings, in which like reference numerals refer to like parts, and in which:

FIG. 4A is a schematic illustration of a method of making a reticulated detector by laser micro-milling, and illustrates the spatial and temporal control of the laser;

FIG. 4B illustrates a series of grooves formed by the method of FIG. 4A;

FIG. 4C illustrates one possible technique for milling a grove;

FIG. 4D illustrates the path of the sample relative to the laser beam during milling of a series of spaced, parallel grooves according to another technique;

FIGS. 5A to 5D are schematic illustrations of a series of steps in the laser micro-milling method;

DESCRIPTION OF THE EXEMPLARY EMBODIMENTS

Figure 1:
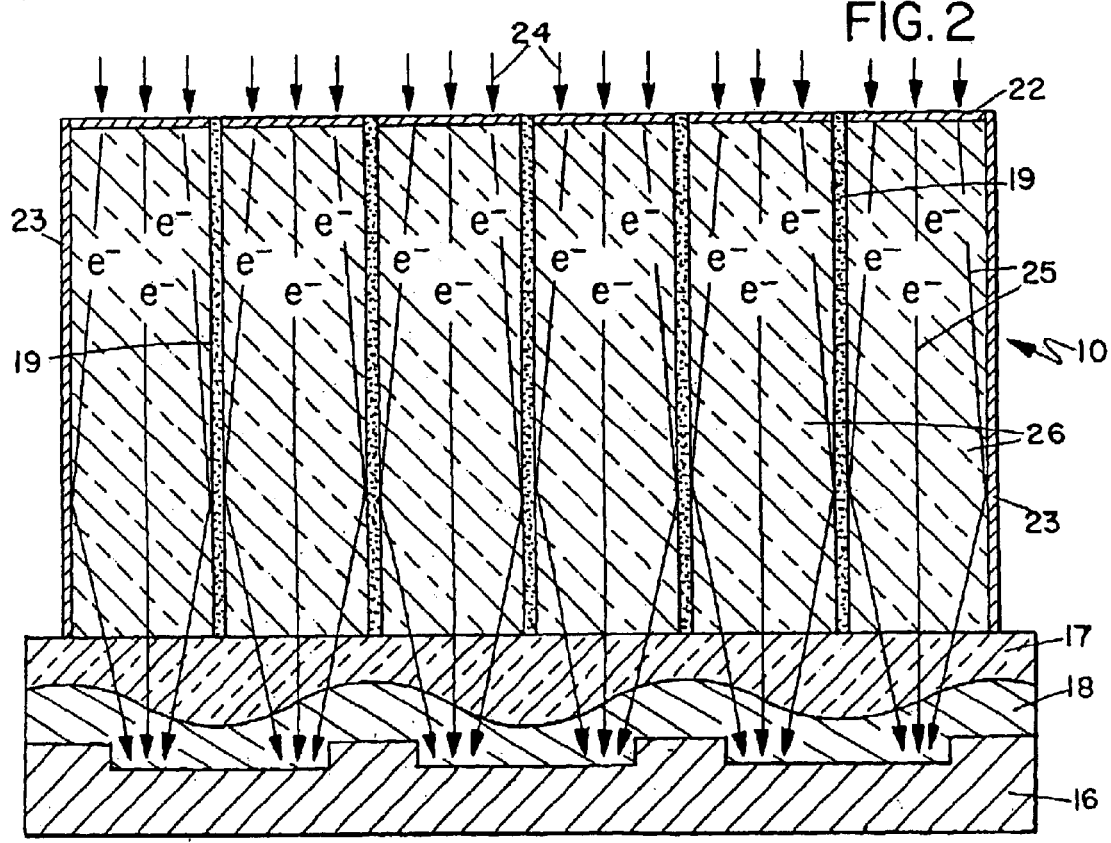
FIG. 1 is a schematic vertical cross-section through an X-ray focal plane array detector according to a first embodiment of the present invention.

FIG. 1 of the drawings illustrates an X-ray focal plane array detector assembly 10 according to a first embodiment of the present invention. The assembly basically comprises an array of reticulated pixels 26 preferably formed from a selected phosphorescent material of high uniformity, and a visible light pixelated detector 16 coupled to the lower end of the pixel array such that each of the pixels 26 is aligned with a respective pixel of the detector 16. The phosphorescent material of pixels 26 gives off light when exposed to X-rays 24. Kerfs or grooves 15 are located between adjacent pixels 26, and the grooves are completely filled with a glue material 19 which is substantially reflective to visible light.

Since X-ray photoelectric absorption is dependent approximately to the fourth power of atomic number ($Z^4$), the material for forming pixels 26 is of a high atomic number, preferably greater than 30. The thickness of the crystal, or height of the reticulated pixels, is arranged to be sufficient to absorb substantially all the X-rays involved. The material of pixels 26 may be a single high quality crystal, a glass or a plastic with embedded fluorescence centers, as discussed in more detail below.

The upper end of each pixel 26 is coated with a thin film 22 of metal or other light reflecting material. The layer is preferably of a metal of low atomic number, preferably less than 15, so that only minimal X-ray absorption will occur in layer 22. Suitable materials are beryllium and aluminum, for example. The outer surfaces of the pixels 26 on the outermost sides of the array are preferably coated with a thin film 23 of a light reflective metal of high atomic number. Alternatively, all surfaces of the pixels may be coated with a layer of metal prior to filling the grooves with adhesive 19. All sides of the pixels will be coated with a metal of high atomic number while the top surface of the pixels are coated with a low atomic number metal. The detector 16 has an upper layer 18 of insulating material, and is attached to the lower end of the pixel array via a layer 17 of index matching adhesive material.

The array of pixels 26 may be a square, x-y array, with each pixel of square or rectangular cross-section. However, it will be understood that the pixels may be of other shapes, such as cylindrical, triangular, or the like. Each pixel in the array may be of identical shape and dimensions to all other pixels for achieving uniform imaging. Mixed shapes and sized of pixels may be used for special purposes, for example to compensate for irregularities in the underlying visible FPA (focal plane array) detector.

In this embodiment, incoming X-rays 24 are converted to light rays 25 which are guided along the pixels 26 into the underlying detector pixels. The height of the pixels 26 is arranged such that substantially all X-rays will be converted into light before reaching the detector 16, which is preferably of a silicon material and susceptible to damage by X-rays. The use of a reflecting medium both between adjacent pixels and at the upper end of each pixel, as well as on all outer or external faces of the array, will reduce or eliminate light loss by scattering from the respective pixels. Each pixel serves as a light guide for channeling the converted visible photons to the active areas of the corresponding visible detector pixel. The pixels are isolated from each other by the light reflective glue material filling the grooves between adjacent pixels, which will substantially eliminate scattering losses and cross talk between pixels. The pixels are fabricated so as to have very smooth walls of excellent optical quality, so that the pixels will be able to serve as highly effective light guides for the converted light. The design of the pixel array has the potential of increasing substantially the light collection efficiency, beyond the approximate doubling collection obtained by introducing the upper reflective layer. This can be very significant in reducing the X-ray dose required for medical radiography, and increasing sensitivity and resolution.

Figure 2:
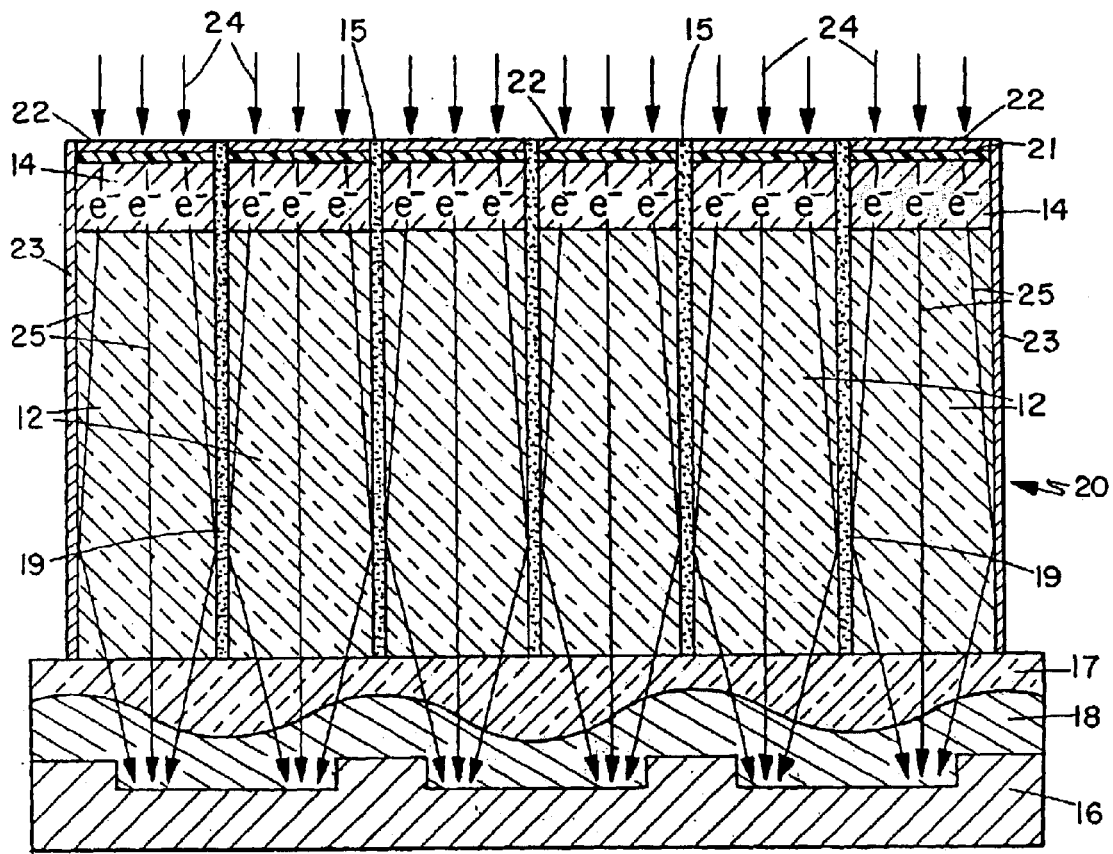
FIG. 2 is a schematic vertical cross-section through an X-ray focal plane array detector according to a second embodiment of the present invention.

FIG. 2 illustrates an X-ray focal plane array detector assembly 20 according to a second embodiment of the invention. In this alternative, instead of reticulating an X-ray phosphorescent material, a good quality optical crystal has a thin layer 14 of high performance scintillation powder bonded to one surface. The assembly is then reticulated to form an array of optical pixels 12 each with a thin layer 14 of high performance scintillation powder bonded to the top of each pixel. A protective or humiseal layer 21 is bonded on top of the phosphor layer 14 prior to reticulation. As in the previous embodiment, the entire assembly is reticulated to form grooves or kerfs which are completely filled with a reflective adhesive material 19, and the upper end of each layered pixel is coated with a thin layer 22 of a light reflecting material, preferably a metal of low atomic number, such as beryllium or aluminum. The outer side surfaces of the outermost pixels in the array are also coated with a thin metal reflective layer 23 of high atomic number. Alternatively, the pixel surfaces may all be coated with a thin metal layer prior to adding the adhesive. The embodiment of FIG. 2 is otherwise identical to that of FIG. 1, and like reference numerals have been used for like parts as appropriate.

In this embodiment, X-rays 24 impinging on the upper end of the detector array will be converted to visible light in the upper phosphor reticulated layer 14. Resultant visible light rays 25 will be channeled through the optical guides 12 into the corresponding pixels of the visible FPA detector 16 attached to the lower end of the array. Pixels 12 are manufactured from high quality single optical crystal of glass or plastic material. The optical crystal is preferably of a high atomic number material so as to block any residual X-rays from reaching the sensitive visible detector 16.

One advantage of the embodiment of FIG. 2 is that the scintillator for the bonded powder layer 14 and the optical guiding glass can each be individually optimized, combining the expertise in the phosphor industry with the well established manufacturing of excellent optical crystals. This detector assembly may therefore be less expensive to manufacture than that of FIG. 1. However, a disadvantage over the previous embodiment is that light scattering in the powder scintillator is unavoidable, and may result in a degradation in resolution.

Although in the illustrated embodiment, light generated in the phosphor layer is guided by means of a reticulated optical crystal into the underlying visible FPA detector, alternative light guiding structures may be used in other embodiments, such as fiber optic faceplates.

Figure 3:
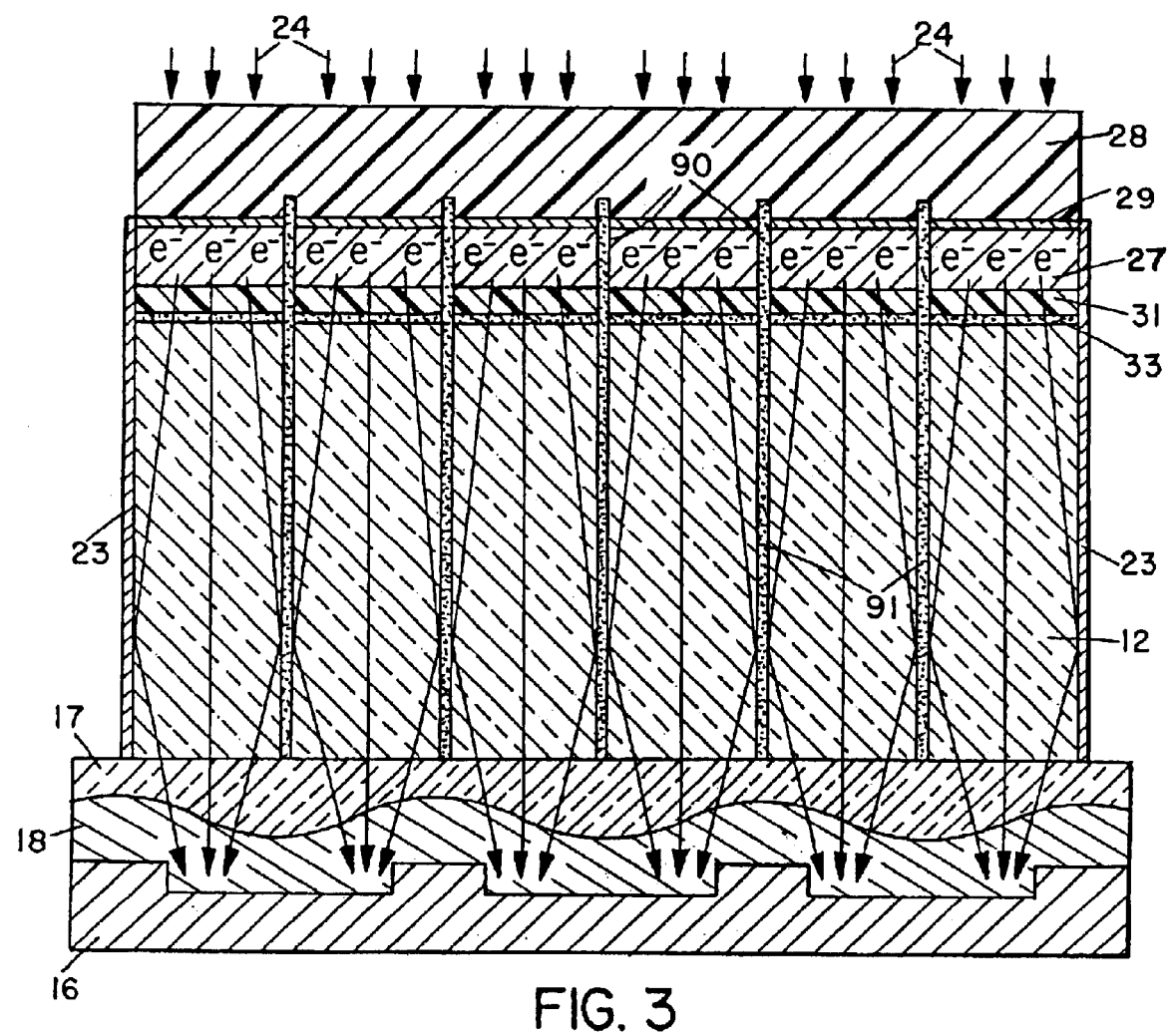
FIG. 3 is a schematic vertical cross-section through an X-ray focal plane array detector according to another embodiment of the invention.

FIG. 3 illustrates a modified detector assembly 30 which is similar to that of FIG. 2 but which is assembled differently. In the embodiment of FIG. 3, as in the previous embodiment, a high quality optical crystal is reticulated to form light guiding pixels 12 which are bonded to an underlying visible FPA detector 16 in the same way as in the previous embodiment, and like reference numerals have been used for like parts as appropriate. However, unlike the embodiment of FIG. 2, where a phosphor layer 14 is bonded to the top of the optical crystal prior to reticulation, the layered phosphor in this embodiment is reticulated separately from the optical crystal, and the two parts are then bonded together via an index matching adhesive layer 33.

A thin layer 27 of phosphor powder is bonded to a metal layer 29, which in turn is bonded to a substrate or supporting layer 28 of a low atomic number material which is transparent to X-rays. The other face of the phosphor layer is coated with a protective humiseal layer 31. The resultant multi-layer assembly is then reticulated to form a grid of pixels separated by grooves or kerfs, and the grooves or kerfs are filled with a light reflective adhesive material 90. The grooves or kerfs may be coated with a thin layer of a low atomic number metal prior to filling with adhesive material 90. Similarly, the reticulated optical crystal has grooves filled with light reflective adhesive material 91. The grooves may also be coated with a thin layer of metal prior to adding the glue, although the metal in this case will be of a high atomic number. The grooves in the multi-layer phosphor assembly extend down into, but not completely through, the substrate or support layer 28. The reticulated optical crystal and reticulated, multi-layer phosphor are then bonded together with the humiseal layer 31 facing downwardly, such that each pixel in the multi-layer phosphor is aligned with a corresponding light guiding pixel 12, as indicated in FIG. 3. The substrate layer 28 used to support the bonded phosphor powder during reticulation thus becomes the uppermost layer of the detector array.

This assembly operates in substantially the same way as the embodiment of FIG. 2. Incoming X-rays 24 pass through the substrate layer 28, which is substantially transparent to X-rays, and are converted to light 25 in the thin phosphor layer 27. The resultant light will then be channeled through the optical guides to the corresponding pixels of visible FPA detector 16. As in the previous embodiment, the optical guides are of high atomic number material so as to block any residual X-rays. The reflective coating on all sides of each of the pixels will reduce or eliminate light escaping out of the pixels and cross talk between adjacent pixels, thus providing improved sensitivity and resolution.

Instead of a thin metal reflective layer bonded on top of the pixels, a high reflection, multi-layer dielectric coating of low atomic number material may alternatively be used. Metal layers may also be deposited on the sides of the pixels prior to introduction of the glue or adhesive into the kerfs or grooves, for enhanced reflection, as noted above.

In the embodiment of FIG. 1, the material of pixels 26 may be an intrinsic scintillator or an extrinsic scintillator. There are therefore three possible alternative types of scintillator material, two of which (intrinsic and extrinsic scintillators) are uniform materials used in the embodiment of FIG. 1, and one of which is used in a bonded powder state in the layered configuration of FIG. 2 or FIG. 3. A disadvantage of the embodiment of FIG. 1 using a single, micro-milled scintillator crystal is its availability and price. However, it has advantages over the layered arrangement of FIGS. 2 and 3, since it reduces scattering and may permit total x-ray absorption over the long pixel, without jeopardizing resolution.

The following two examples were found to be particularly suitable and also met those criteria listed above. In the following examples, Example 1 is for a scintillator layer as in FIG. 2 or FIG. 3, and Example 2 an intrinsic scintillator for the embodiment of FIG. 1.

EXAMPLE 1

In this example, a layer of $Gd_2O_2S$:Tb: (4 μm particle size) with a 7.5 mg/cm$^2$ coating weight was coated on a 1 mm thick x-ray absorbing glass. The resultant coated glass was then micro-machined to produce an array of pixels or light guides each having a coating layer of x-ray phosphorescent material at the upper end, as in the embodiment of FIG. 1. The fluorescence emission wavelength spectrum peaks at 545 nm and the decay time is approximately 1 mS. The substrate glass density is 4.8 g/cm$^3$, and it has a Young's modulus of $62.7 \times 10^2$ N/m$^2$, and a temperature expansion coefficient of $81.8 \times 10^{-7}$/C. The transmission of the fluorescence light at 545 nm through the substrate is above 92%.

EXAMPLE 2

In this example, a single crystal of bismuth germanate ($Bi_4Ge_3O_{12}$) was used to form an array of phosphorescent crystals in the embodiment of FIG. 2. This material is a high atomic number cubic (Eulytine) crystal of high density, 7.13 g/cm$^3$. The crystal is an excellent phosphor for X-rays with a slightly lower fluorescence light output than $CdWO_4$, and it emits at around 480 nm. The index of refraction is 2.15, it has a very fast decay time of around 300 nS, and a relatively low afterglow (7 mS). Its thermal coefficient is $7 \times 10^{-6}$/C. However, it has quite a large temperature dependence response in the temperature range of 0° to 60° C. This crystal is relatively hard (Young's modulus=$10.56 \times 10^{10}$ N/m$^2$) and is not hygroscopic. It also does not have any crystalline cleavages.

Both of the above materials fulfill a great part of the desired criteria listed above, and are currently commercially available. Other suitable candidates which exhibit high efficiency x-ray fluorescence along with most of the other criteria listed above, are $CdWO_4$(cadmium tungstate), $Y_3Al_3O_{12}$:$Eu^{+3}$(yttrium aluminum garnet doped with europium), YAG:Ce, CsI(Tl), CsI(Na), CsI, NaI, CsF, CaF (Eu), LiI(Eu), and $Gd_2SiO_5$:Ce. Other potential candidates are $LuTaO_4$:Tb and $LuTaO_4$:Nb, which may be bonded to an optical crystal or glass substrate, and single crystals of $Y_2O_3$, which are very robust. Other examples for the layered detector of FIGS. 2 and 3 are $Gd_2O_2S$:Pr,Ce,F, ZnCdS:Ag, and $Y_2O_2S$:Eu.

Of the foregoing examples, it has been determined that bismuth germanate is particularly advantageous for an XFPA detector. Theoretical calculations indicate that an XFPA digital imaging system using a reticulated bismuth germanate ($Bi_4Ge_3O_{12}$) phosphor for conversion of x-rays into light rays may exceed the imaging performance of a corresponding current XFPA imaging system by almost an order of magnitude.

The dimensions of the XFPA detector apparatus 10,20,30 and particularly the array of pixels in each of the above embodiments, is also critical for achieving the desired performance. It is desirable for the kerfs or grooves to be as narrow as possible, in order to minimize the dead area of the detector. The groove should be as narrow and as deep as possible without damaging the adjacent pixel structure. The micro-milling method described below allows the grooves between pixels to be made relatively narrow, and the groove or kerf width is preferably in the range from 4 μm to 15 μm. The cross-sectional dimensions of each pixel were in the range from 25 μm×25 μm to 250 μm×250 μm, in one exemplary embodiment and the height of the pixel was of the order of 1 mm. The cross-sectional dimensions of the entire array are determined by the dimensions of the available high quality visible light pixelated detector. One suitable detector which is currently available is a CCD detector, available in sizes of the order of 1"×1", with 1000×1000 pixels where the pixels are 25 μm×25 μm. The scintillator thickness is selected to be sufficient to completely stop the penetration of any X-rays of the energy and dosage typically used in medical or other radiography applications. The selected dimensions of the groove produce an aspect ratio (kerf height divided by kerf width) which may be in the range of 5:1 to 150:1. Additionally, the laser processing provides pixel walls which are optically finished or polished to a smoothness sufficient to substantially reduce or prevent scattering.

The detector designated above may be used in an x-ray or radiographic imaging system, for medical or other purposes, such as non-destructive testing. As mentioned above, a single XFPA pixelized detector as described above will typically be limited by the currently available detectors for the fluorescence induced light. If a CCD detector is used, the low cost detector matrix currently available has a size of the order of 1 inch by 1 inch. Thus, for visualizing larger objects, a number of XFPA detectors may be butted side by side to cover the area of interest. However, this results in a rather bulky detector for target objects of up to 20" by 20" in size, such as bones and body organs.

The laser micro-milling method used for reticulating the phosphor samples according to the above exemplary embodiments of the invention will now be described in more detail with reference to FIGS. 4 and 5. The same method may be used for reticulating a single phosphor crystal as in FIG. 1; or an optical crystal with a phosphor layer on top as in FIG. 2, or for separate reticulation of a layered phosphor and an optical crystal as in FIG. 3, in each case with or without an upper metal layer. The method requires precise control in order to achieve the desired high aspect ratio and narrow kerf grooves without causing any damage to the pixels themselves. This is because the materials which are most suitable for forming the phosphorescent pixels are also materials which are particularly difficult to laser machine properly due to their relatively low melting points or are chemically unstable at higher temperatures. Other materials cannot tolerate wide temperature differentials, and will crack under such conditions. Thus, the laser cannot be held at one spot on the crystal for any length of time, or the material will decompose. It is extremely important with such materials that the laser beam irradiance, or energy/unit time/unit area, be kept substantially constant during the entire abrasion process, and be such that the material does not melt into the pixel structure, decompose, damage or crack.

There are a number of different parameters which must be controlled in order to keep the irradiance at the desired constant level. In the method as illustrated in FIG. 4A, a laser 70 directs a laser beam 72 at an underlying crystal or substrate 74 held in a stage or sample holder 76 on a movable table 78 which can be moved in perpendicular x and y directions, and also rotated in a θ direction by x-y and θ drive, or in any other computer pattern (curved or linear). The sample holder is designed in a conventional manner so as to lock the sample in a precise position and alignment during laser processing. The table may be any suitable x-y table, such as the Anoride Table produced by Anorad Corporation of New York. This moving table has a built in x-y-θ drive as well as a velocity feedback control to ensure a substantially constant velocity. Movement of the table is controlled by computer 80 according to selected program instructions. Additionally, the laser has an adjustable focus to provide a z-direction adjustment relative to the table, also under the control of computer 80.

In the illustrated embodiment, the laser beam is held stationary in the x-y direction during the micro-milling process, while the table is moved back and forth in a generally linear path, let us say in the x direction, as illustrated in FIG. 4C. Then the table is moved to the next line, and so on, so that the laser beam mills a plurality of parallel grooves 82 in the top of the crystal, as illustrated in FIG. 4B. The table is then moved in the other direction (say in the y direction) so that a set of parallel grooves perpendicular to grooves 82 can be milled in a similar manner, forming a reticulated x-y grid pattern. The program controlling both the laser actuation and movement of the table is designed such that the laser is not turned on until the moving table has reached a constant velocity, at the desired location, as illustrated in FIGS. 4A and 4B, which demonstrates the on-off sequencing of the laser.

As best illustrated in FIGS. 4A and 4C, the computer starts a scan at point O, about 50 μm prior to the start of the micro-milling at point A. Thus, the laser is off as the table accelerates up to constant velocity. From A to B, the table velocity is constant and the laser is on. At point B, the laser is turned off, while the table moves on from this point, starting to decelerate after point B to point E. At point E, the direction of movement is reversed. The table then accelerates back in the opposite direction and the laser is turned on again at point B, when the velocity is again constant and stopped at point A, after which the table decelerates to point O. The same line is then repeated along the surface of the crystal.

The laser intensity and velocity of travel is such that only a small portion of each groove is milled during each pass of the laser along the groove, as best illustrated in FIGS. 5A to D. After several passes of the laser along a particular groove 15, the groove will be ablated to a bottom end 84a. FIG. 5B shows a successive stage where the groove has been ablated to a depth 84b. As illustrated in FIGS. 5C and 5D, as the groove deepens, it will act as a wave guide for the laser beam, concentrating the beam at the current lower end of the groove 84c, 84d, respectively. Typically, the ablation rate is only about 2 to 10 microns for each pass of the laser beam along the groove, and between 10 to 120 passes of the laser are typically preferred in order to fully ablate each groove.

The milling of the reticulated array may be accomplished in a number of alternative ways. For example, each groove 15 may be fully ablated to the desired depth before the table moves on to align the laser with the next groove in the array. Alternatively, each groove may be milled to a certain percentage of the desired depth, say 20%, before the table moves on to align the laser beam with the next groove. After all grooves have been milled to 20%, say, of the desired depth, the procedure is repeated until all grooves are milled to the desired depth. In these two alternatives, the table will move back and forth with the laser beam traveling back and forth repeatedly along the same groove, as generally indicated in FIG. 5C, before moving on to the next groove. In another alternative, the laser beam may make one pass along all grooves in the x-y direction, and then repeat the same sequence for a second pass, and so on, until all grooves are milled to the desired depth in the same pass of the laser. The second of the above alternatives is preferred. In each case, the table will travel at a constant velocity from point A to point B or back from point B to point A, preferably to within ±2%, due to the feedback velocity control built into the x-y table.

FIG. 5D illustrates another alternative where the table moves continuously in a serpentine path, rather than slowing down and reversing direction after every pass along a groove, as in FIG. 5C. The movement starts at point O, then traverses the serpentine path from point O to point F, with the laser activated at the start and turned off at the end of each groove, i.e., the laser is on from point A to point B in the first pass, from point B to point A in the second pass, and so on to the end of the serpentine path.

During the laser micro-milling process, the focus of the laser is adjusted periodically by a certain amount (z-direction adjustment) to optimize the coupling of the light into the groove. Typically, the focus is changed by about 3 microns after about 20 passes of the laser. The procedure is repeated so that the laser beam travels along each of the grooves numerous times, until each groove is machined to the desired depth. The laser fabricated walls will be smooth and will act as light guides for further processing of each groove, concentrating the light on the end of the groove which is currently being ablated. Each groove is preferably milled to a depth so as to almost penetrate the crystal, but terminates just short of the bottom face of the crystal.

In addition to controlling the direction and velocity of the table, and the focus of the laser beam, and actuating the laser only when the table has reached a constant velocity, the laser parameters are also strictly controlled by the computer to ensure uniform processing and reduce the risk of damage to the individual pixels. The laser in one example was a computer controlled Nd:YAG single mode CW laser which is Q-switched to provide continuous pulses of less than 100 nS in width. The Nd:YAG laser can be operated in the infrared 1.06 μm fundamental spectral line, the second harmonic line at 0.53 μm, the third harmonic line at 0.35 μm, or the fourth harmonic line at 0.26 μm. The laser is preferably optimized to obtain a pure $TEM_{00}$ symmetrical mode at the sample site. This mode of operation will result in the smallest focusing beam spot size at the target. The frequency of the acoustic switch is preferably in the range from 0.5 to 30 kHz, and the intensity is preferably in the range from 0.1 mW to 5 W. The laser is also controlled so that the first, larger pulse after the laser is first switched on is "killed", by providing a first pulse killer in the laser control circuitry or by an external light switch. Such circuitry is conventional in Q-switched lasers. The subsequent laser pulses will preferably be of substantially equal amplitude and width to around ±2%.

The laser intensity and the velocity of the table, as well as the focus of the laser beam, are all controlled so as to provide a substantially constant flux per unit area, or energy per unit time per unit area, along the groove. The flux per unit area is selected based on melting or decomposition point and opacity of the crystal to be milled, such that only the material in the groove itself is ablated and the energy applied is such that the walls of the groove will not be damaged. The irradiance or flux per unit area at the processing location may be in the range of 1 to $10^5$ Watts/cm$^2$, depending on the characteristics of the substrate material. For micro-milling of $Bi_4Ge_3O_{12}$, it was found that an irradiance of 40 Watts/cm$^2$ produced optimum results. The optimum flux per unit area, to ensure that just the groove area is ablated and the surrounding pixel structure is not damaged, may be determined experimentally for each desired phosphor material. The material is exposed to a low intensity laser beam, and the intensity is gradually increased until the material just starts to ablate in the beam area, without spreading into adjacent regions. This is then used as the laser intensity parameter for that material. For example, in the multi-layered configuration, where there is an upper metal layer, a higher flux per unit area is preferably used for the first pass of the laser, in order to cut through the metal, and the flux is then preferably lowered to the predetermined level for the underlying phosphor material. The table velocity is preferably in the range from 0.5 to 0.001 inch/sec.

It has been found that, by strictly controlling the laser parameters and the constant velocity of the movement of the crystal relative to the laser beam, excellent reticulation of a phosphor crystal as in FIG. 1, or a layered phosphor as in FIGS. 2 and 3, can be achieved. This process produces high aspect ratio reticulation in phosphor materials with a groove width of less than 6 μm between adjacent pixels. The laser fabricated pixel walls have been demonstrated to be very smooth and of high optical quality, as a direct result of the strict control of the laser and motion parameters. Due to the smoothness of the laser fabricated walls and their optical quality, the partial micro-milled groove will itself serve as a light guide for further laser processing, allowing transfer of self-trapped laser energy to the bottom of the groove for further micro-milling. This permits grooves of a very high aspect ratio, up to 120:1, and narrow width, of less than 6 μm, to be laser machined in materials which are conventionally considered to be difficult to machine with a laser.

The laser micro-milling process described above may be used to reticulate a single piece of phosphor material, either in the form of a phosphor crystal or a glass or plastic doped with scintillator elements. The phosphor material may be reticulated alone or with a thin metal film or layer deposited on its upper surface, as in FIG. 1. The metal layer may alternatively be applied after reticulation. The process may also be used to reticulate an array as in FIG. 2, where a layer of phosphorescent material in the form of a bonded powder is coated on top of an x-ray absorbing glass substrate, either with or without a metal layer on top. In either case, excellent results were achieved by strict process control as described above.

The method of forming the thin reticulated phosphor layer on top of the reticulated optical glass in the embodiment of FIG. 3 is preferably in two stages. Firstly, a granular phosphor layer bonded with epoxy or the like is deposited on a supporting substrate 28, preferably with an intervening thin layer 29 of metal. A humiseal layer 31 is preferably deposited on top of the phosphor layer for protection of the phosphor layer. The layered phosphor is then reticulated in the manner described above, with the grooves extending through the entire thickness of the phosphor and partially into the substrate. The humiseal protective layer 31 may be of any suitable protecting polymer or epoxy material which is compatible with the laser micro-milling process and the fluorescence effects. This layer adds strength to the granular phosphor layer, and avoids loss of particulates as a result of laser micro-milling, ensuring that the milled pixels retain structural integrity.

A suitable optical crystal of equivalent dimensions is then reticulated or laser micro-milled separately to produce a pixel array of identical shape and dimensions to the phosphor structure. After filling the grooves in both the layered phosphor and the optical crystal with a reflective adhesive material, the reticulated phosphor structure is bonded to the reticulated optical crystal with the pixels in alignment. The advantage of micro-milling these components separately is that the laser can be optimized to the particular material being milled in each case, ensuring the formation of uniform, smooth sided pixels through the entire structure.

The thin, coated phosphor layer may alternatively be bonded to another type of light guiding structure, instead of the reticulated optical crystal, such as a fiber optic faceplate, provided that the light channel diameters are smaller than the reticulation, to maintain the resolution required.

After formation of the pixels, either in a single, thick phosphor or in the separately reticulated thin phosphor and optical crystal layered structure, the structure is cleaned to remove laser debris. Preferably, the pixel array is cleaned by means of a conventional ultrasonic cleaning process. The power and pulse shape of the ultrasonic cleaning head is adjusted to produce effective cleaning of the laser debris without damage to the reticulated structure.

Although the pixels are preferably of square cross-section in the embodiments described above, it will be understood that they may be of other alternative shapes, as required by the detector array architecture. Thus, pixels of rectangular, triangular, cylindrical, or other shapes may be micro-milled in an equivalent manner, by suitable control of the x-y table drive.

After formation and cleaning of the reticulated pixel structure, the structure is preferably checked using an optical high magnification microscope and a scanning electron microscope to ensure that the crystals demonstrate no collateral damage as a result of either the laser micro-milling or the cleaning process. The selected adhesive is preferably introduced into the grooves according to the following technique. It is important that the grooves are completely filled by the adhesive material. This is preferably achieved by introducing the adhesive along one side of the crystal into the grooves under microscope observation, and allowing the adhesive to fill all of the grooves by capillary action. The adhesive is then cured for the required time period.

When the reticulated thick or thin multi-layered structure is fully cured, it is attached to the visible detector preferably via a suitable index matching glue layer 16, maintaining the respective phosphor pixels in alignment with the corresponding visible silicon pixels.

Due to the excellent surface quality of the laser micro-milled pixel walls, the phosphor pixels serve as light-guides for the induced fluorescent light. The reticulation and reflective glue will prevent most of the cross-talk between pixels so that, with a 1:1 match to the underlying silicon visible detector, the resolution of the sandwiched detector will be theoretically comparable to that of the underlying silicon visible detector.

The thickness of the phosphor converter array is preferably designed such that almost no leakage of x-rays through the array and into the underlying electronic circuitry can occur for radiation at the energy and doses typically used in medical or non-medical radiography applications. Experimental testing has shown that, for the embodiment of FIG.

1, a crystal of 1 mm. thickness showed no transmission for x-rays at 40 KeV. For higher energy x-rays, in the 70 KeV level, only $CdWO_4$ and $Bi_4Ge_3O_{12}$ crystals can be used to provide sufficient protection to the underlying silicon detectors and electronics.

Figure 6:
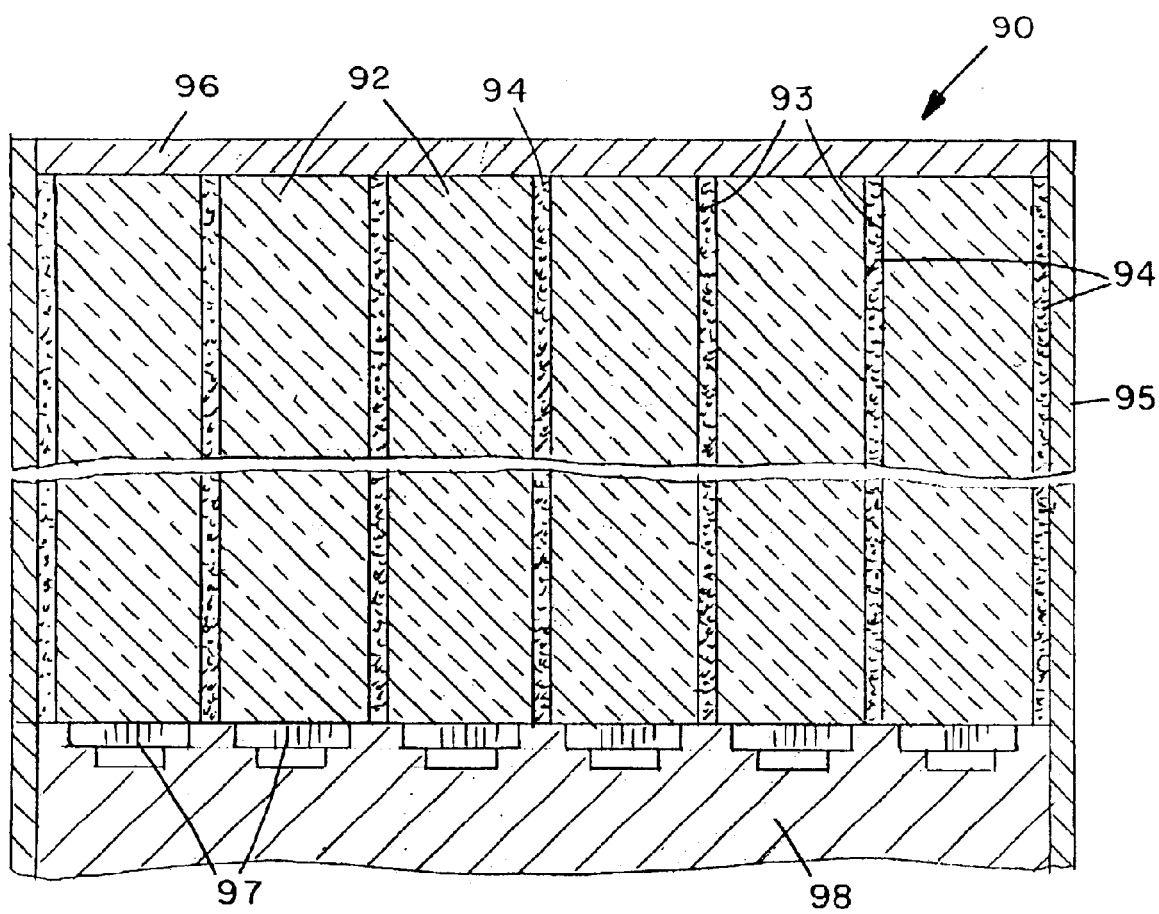
FIG. 6 is a schematic vertical cross-section through an ultrasonic transducer phase array according to another embodiment of the invention.

The laser micro-milling method described above in conjunction with FIGS. 4 and 5 may alternatively be used for forming two dimensional phase arrays in other materials, such as ultrasonic transducer materials for fabricating an improved ultrasonic imaging array. FIG. 6 illustrates an ultrasonic imaging array or 2D matrix ultrasonic transducer 90 formed by the micro-milling method of FIGS. 4 and 5. The array 90 comprises a plurality of elongate, reticulated pixels 92 of a selected piezoelectric material separated by grooves or kerfs 93 filled with a suitable adhesive 94 such as a flexible epoxy material to permit acoustic vibration of the transducer pixels. The pixels are mounted in a suitable enclosure or support 95, and have upper ends covered by a layer 96 of an acoustic matching medium. Each pixel has an electrode 97 mounted at its lower end encased in a suitable backing material 98. It will be understood that leads (not illustrated) will be provided to connect the electrodes to suitable signal (transmitter) and readout (receiver) electronics.

The array may be fabricated in any suitable piezoelectric transducer material. Some high performance piezoelectric materials which are particularly suitable for forming the transducer pixel array of this invention are relaxor ferroelectric single crystals, single crystals of piezoelectric and piezorestrictive materials, and regular and fine grain piezoelectric ceramics. Suitable relaxor ferroelectric materials are:

(1-y) $[Pb(Zn_{1/3}Nb_{2/3})O_3]$+$yPbTiO_3$ abbreviated PZN-PT
(1-y) $Pb(Mg_{1/3}Nb_{2/3})O_3$+$yPbTiO3$ abbreviated PMN-PT, and other similar single crystals homologs, which demonstrate super high electromechanic coefficients (strain>1%) and excellent coupling factors (>85%). Such materials are described in the following articles: S. E. Park and T. R. Shrout, "Ultra High Strain and Piezoelectric Behavior in Relaxor Based Ferroelectrics Single Crystals", J. Appl. Phys. 82, pp. 1804–1811 (1997). S. E. Park and T. R. Shrout, "Characteristics of Relaxor-Based-Ferroelectric Single Crystals for Ultrasonic Transducers", IEEE Tran. On Ultrasonic 44, pp. 1140–1147 (1997). S. E. Park et al., "Crystal Growth and Ferroelectirc Related Properties of $(1-X)Pb(A_{1/3}Nb_{2/3})O_3$-$XPbTiO_3$, A=$Zn^{2+}$, $Mg^{2+}$", ISAF 96 (See Ref. 5), pp. 79–82, (1996). Y Yamashita and N. Ichinose, "Can Relaxor Piezoelectric Materials Outperform PZT?" (Review) ISAF '96, Proc. $10_{th}$ IEEE International Symposium on Applications of Ferroelectricis, East Brunswich, N.J., Aug. pp. 71–77 (1996).

Some suitable piezoelectric or piezorestrictor single crystal materials are $BaTiO_3$(barium titanate), $LiTaO_3$(lithium tantalate), or other piezoelectric single crystals with high elastooptic coefficient. Suitable piezoelectric ceramics for the 2D transducer array are regular grain size (3 μm to 25 μm) or fine grain size (around 1 μm) materials with good transducers characteristics, such as ceramic materials based on different compositions of PZT (lead zirconate titanate or $Pb[Zr,Ti]O_3$). These piezoceramics are commercially available from various different companies, such as EDO Corporation, Electro-Ceramics Division, of Salt Lake City, Utah, Cerac Inc. of Milwaukee, Wis., and others.

The design of the 2D matrix ultrasonic transducer for volumetric imaging requires careful consideration regarding the choices of device materials and architecture in order to provide a compact and reliable medical imager system. The resulting transducer characteristic factors that determine the success of the medical 2D-UTA (two dimensional ultrasonic transducer array) design are: the sensitivity, the ringdown, the axial resolution, the lateral resolution, the acoustic impedance matching, the scanning range, the electrical impedance matching, the beam size, the focusing ability, the physical geometry and the operating control system, as well as the compact packaging to containing the high-density electrical circuitry.

The penetration depth of the ultrasonic waves in humans is limited by their attenuation. The design of the two-dimensional transducer array, including the number of elements, the pitch, the geometry and the resonance frequency, has to be optimized for the selected clinical application and the particular human organ. In general, the image resolution increases with the ultrasonic frequency due to the wavelength decrease. The lateral resolution is determined by the Abbe rule to be $d \cong \lambda * F/D$, where $\lambda$ is the ultrasonic wavelength, F is the focus length and D is the aperture diameter. The axial resolution will be related to the field depth $L \cong 7\mu(F/D)^2$. Consequently, higher frequency will result in higher volume resolution. However, the attenuation of the ultrasonic energy by the body's soft tissue, which is about (0.5–0.7) dB/cm/MHZ, will dictate the final choice of the nominal transducer frequency for the specific medical application.

The main criteria dominating the geometries of the design of the 2D medical ultrasonic array are (i) the desired vibration mode of the individual piezoelectric pixel, (ii) the characteristics of the ultrasonic beam. For the 2D transducer matrix, the preferred vibration mode is of a "piezoelectric bar", in which the pixel dimensions—(length—a, width—b) are smaller than the height—h of the pixel. The piezoelectric bar preferred movement is along the longitudinal direction, however, it is also free to vibrate in both lateral directions. However, the resonance frequency of these modes will be designed to be above the desired band-pass of the transducer. This imposes a high aspect ratio requirement for each pixel. Practical considerations show that h/a (or h/b)>2, for each pixel will serve as the minimal requirement. The thickness of the piezoelectric element is usually selected to be about 0.5 $\lambda_m$, where, $\lambda_m = V_m/f$, is the wavelength, $V_m$ is the velocity within the piezoelectric crystal and f is the center frequency. In order to reduce grating lobes, the pixel-to-pixel spacing, d, must be less than $\lambda$, where $\lambda$ is the wavelength in the propagating medium (tissue). The above-mentioned criteria impose certain design restrictions on the 2D transducer array architecture, such that prior art mechanical saw techniques were unable to produce a 2D-UTA array of optimum dimensions. For example, designing for operation at central frequency of 5 MHz, the resulting wavelength in human tissue is close to 300 μm. This will allow us to achieve high spatial imaging resolution close to ±250 μm for medical diagnosis applications. However, this will require that the center-to-center distance of each pixel of the 2D-UTA to be less than 300 μm. For pixel elements larger than $\lambda$, the appearance of undesirable grating side lobes will become disturbingly pronounced in the pulse-echo image. Now, if the requirement of the transducer is to demonstrate a broad bandwidth, it will have significant energy carried in frequency components above 5 MHz, which means that practical pixel elements should be placed center-to-center closer than 150 μm, to avoid the effect of the grating lobes. Good design of the 2D-UTA with symmetrical 200% line width at 5 MHz operation will require the array elements to be as small as 100 μm in length (width). The laser micromachining method described above in connection with FIG. 4 and 5 provides the technological means to achieve the fabrication of such a high-density of small and tail pixels (high-aspect ratio) in the appropriate piezoelectric single-crystal and ceramic materials. This novel technique allows us to design and successfully fabricate a portable, miniature, high resolution, highly-sensitive, electronically tuned, two-dimensional ultrasonic medical volumetric imager, with high density and very small dimensions for medical diagnosis even within vessels in the human body.

As noted above, the laser micro-milling method of FIGS. 4 and 5 may be used for reticulating the piezoelectric crystal or ceramic material for fabricating the 2D ultrasonic transducer array of FIG. 6. The method, as before, requires precise control in order to produce the desired high aspect ratio and narrow kerf grooves, as well as the desired small pixel dimensions and large number of pixels. An optically polished, uniform flat wafer sample of the transducer material is first placed on a stage or sample holder on a movable table, such as table 78 of FIG. 4A, and a laser 70 directs a pulsed laser beam onto the sample. Movement of the table relative to the laser, or of the laser relative to the sample, is controlled by a suitably programmed computer 80 in order to form the desired pattern of grooves in the sample. In the foregoing embodiments of FIGS. 1 to 3, spaced straight grooves in x and y directions were milled in order to produce a rectangular, x-y array of pixels, with a pattern 100 of the form illustrated in FIG. 7, for example. The 2D ultrasonic transducer array of this embodiment may also be formed into a square or rectangular array 100 by suitable control of the laser micro-milling process.

Figure 9:
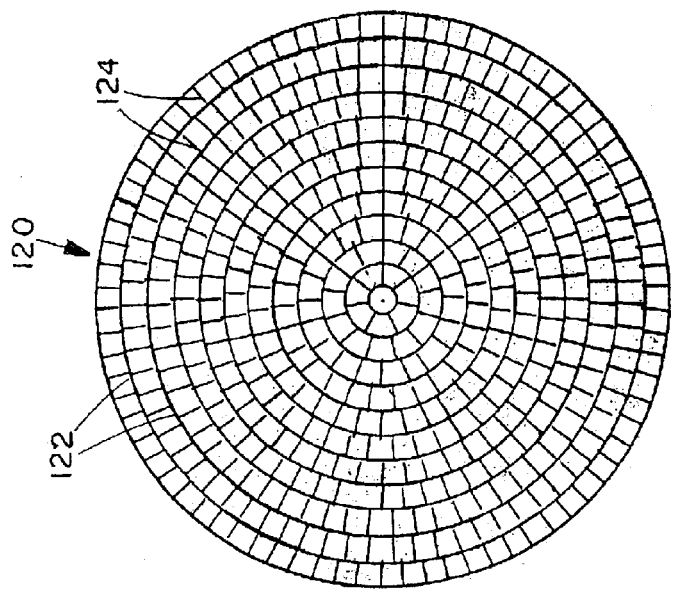
FIG. 9 is a top plan view of another imaging phase array configuration.
Figure 8:
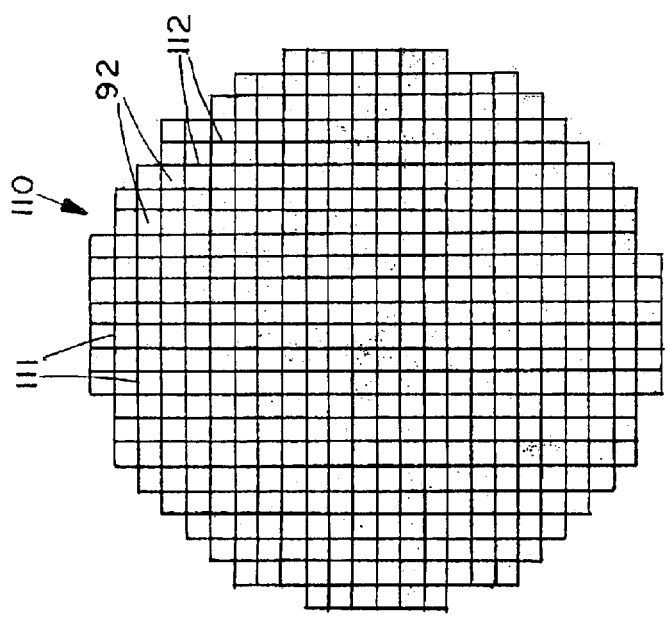
FIG. 8 is a top plan view of an alternative imaging phase array configuration.

In the case of a 2D ultrasonic transducer array for forming images of organs or areas inside the human body, it is sometimes advantageous to move the array closer to the region of interest within the body, for example via a narrow catheter. A circular cross-sectional shape of the array would be advantageous in such circumstances. Thus, FIG. 8 illustrates one possible example of a circular 2D ultrasonic transducer array 110 which may be readily formed according to the method of this invention. Again, this is formed by cutting spaced parallel grooves 111, 112 in x and y directions, and then cutting the periphery to form a generally round shape. FIG. 9 illustrates another alternative 2D transducer array 120 of circular shape. In this case, rather than straight line grooves 111, 112 in perpendicular x and y directions, a series of circular grooves 122 of increasing diameter are cut, with radial grooves 124 between each adjacent pair of circular grooves 122 to form the separate pixels 90. The same arrangement as generally illustrated in FIG. 4A may be used to form the grooves 122, 124 in the sample of ultrasonic transducer material, since the table 78 has a computer-controlled x-y drive, and may therefore be manipulated under the laser to form the desired curved or linear grooves 122, 124. Another possibility is to use an x-y-θ drive to scribe the circular patterns. The radial grooves 124 may then be formed by suitable x-y. Alternatively, the laser beam may be maneuvered over the sample, with the table held stationary. As in the previous embodiment, the computer controls the laser actuation and the table movement such that the laser is not turned on until the table has reached a constant velocity. Additionally, the laser intensity and velocity of travel along a groove is such that only a small portion of a groove is milled during each pass of the laser along the groove, and the laser must be passed several times along the groove in order to ablate the groove to the desired depth, as indicated in FIGS. 5A to 5D. The focus of the laser may also be adjusted during the milling process, in the same manner as described above in connection with the first embodiments.

Figure 7:
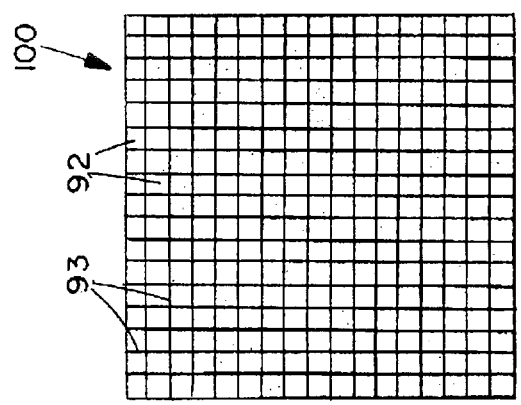
FIG. 7 is a top plan view of one imaging phase array configuration.

In an exemplary embodiment of the laser micro-milling process to form a 2D ultrasonic transducer array as illustrated in FIG. 6 in any of the alternative patterns illustrated in FIGS. 7 to 9, the laser was a pulsed, diffraction limited, TEMoo laser with high control of pulse-to-pulse energy. The selected energy is above the threshold for ablation of the particular

| | |
|---|---|
| Pulse Width: | Narrow Pulses, typical <70 nS |
| Wavelength: | (Typical) $1^{st}$, $2^{nd}$, $3^{rd}$, $4^{th}$ harmonies of YAG laser, corresponding to 1064, 532, 366, 266 nm, or other reliable pulsed lasers. |
| Repetition Rate: | (Typical) 500 to 40000 Hz |
| Laser Average Power: | (Typical) 10 mW to 3W |
| Constant Velocity: | (Typical) 25 μm/sec to 25 × $10^3$ μm/sec |
| Pattern of Movement: | Computer high precision controlled to pattern the required grooves at constant velocity. The patterns are delineated by straight or curved high-aspect-ratio grooves, to obtain the best steerable ultrasound beam forms. These ultrasonic beam forms are designed to provide narrow ultrasound beam profiles, no side lobe and low-noise clutter at high steering angles. |

This method can achieve pixel cross sectional dimensions (a and b dimensions) from 25 μm to 1000 μm, in a two dimensional matrix of up to 128×128 pixels, with a groove width of 6 μm to 25 μm. This produces a very high pixel density. The density for a pixel size of 1000 μm by 1000 μm is calculated as follows:

$$\text{Density} = 1 \text{ cm}^2/(1000)^2(10^{-4})^2 = 100 \text{ pixels/cm}^2$$

The average density, for a pixel size (a and b dimension) of 200 μm, is as follows:

$$\text{Density} = 1 \text{ cm}^2/(200)^2(10^{-4})^2 = 2.5 \times 10^3 \text{ pixels/cm}^2 = 2500 \text{ pixels/cm}^2$$

The maximum density, for a pixel size of 25 μm, is as follows:

$$\text{Density} = 1 \text{ cm}^2/(25)^2(10^{-4})^2 = 1.5 \times 10^5 \text{ pixels/cm}^2$$

Therefore, the pixel density achievable with this invention is in the range from around 100 pixels/cm$^2$ up to 1.5×10$^5$ pixels/cm$^2$, much higher than was achievable in any prior art two dimensional ultrasonic transducer array. An aspect ratio of up to 100:1 of depth versus width of the groove can be achieved. The two-dimensional array also has a high fill factor, i.e. effective active area. If the total pixel size, center to center (i.e. pixel plus groove), is B, then the total area taken up by each pixel in an array is B$^2$, while the active area is b$^2$, where b is the actual width of a pixel. If the width of a kerf or groove between pixels is k, then the fill or fill up factor is calculated as follows:

$$\text{Fill Factor} = \text{Active area/total area} = b^2/B^2 = (B-k)^2/B^2$$

Thus, the fill factor for the minimum pixel size of 25 μm and groove or kerf width of 6 μm is as follows:

$$\text{Fill factor} = (25-6)^2/25^2 = 0.578 = 58\%$$

For a typical or average pixel size of 200 μm and kerf width of 10 μm, the fill factor will be around 90%, while for the maximum pixel size of 1000 μm and groove width of 25 μm, the fill factor is around 95%. The method is such that no collateral damage to the pixels is produced, and the walls are formed almost straight with high edge integrity. Thus, this method achieves successful fabrication of high density, high fill factor, small cross sectional area, and tall pixels in suitable piezoelectric materials, producing a portable, miniature, high-resolution and highly sensitive two-dimensional ultrasonic medical volumetric imager. The dimensions can be made very small so that the high frequency, high density transducer phase array can be deployed via a catheter within a human or animal body if necessary.

The actual pixel dimensions selected will be dependent on the acoustic wavelength in the object to be studied. The pixel size must be less than $\lambda$, where $\lambda$ is the acoustic wavelength within the crystal. Thus, in a 5 MHz transducer, the acoustic wavelength for body tissue will be around 300 $\mu$m, and the pixel size should be of the order of 150 $\mu$m or less.

The ultrasonic transducer pixel array fabricated according to the method of this invention will provide better imaging resolution and can be made in desirably small dimensions for use in medical applications including diagnosis and therapy. The transducer array may be used for medical diagnosis, therapeutic procedures, and for nondestructive evaluation of materials and components in various fields. The array will have the capability of achieving higher resolution than was possible with prior art ultrasonic 2D transducer arrays, which could not provide the fine pixel dimensions along with the straight walls and high aspect ratios possible with this invention.

It has been shown theoretically that a circular 2D transducer array as illustrated in FIG. 9 will achieve better images in certain cases than an equivalent linearly reticulated 2D phase array transducer of the pattern illustrated in FIGS. 7 and 8. Additionally, the array of FIG. 9 is more compact and the perfectly round shape makes it more suitable for intraluminal applications. The total diameter of the phase array may be of the order of 1 mm., while still providing the desired number of small, high aspect ratio pixels, and it can then be readily fitted into a narrow catheter. A circular symmetrical 2D transducer array will provide improved ultrasound beam profiles for optimized medical imaging, producing higher spatial resolution and lower off-axis acoustic clutter than an equivalent linearly reticulated array. Simulations have shown that the array illustrated in FIG. 9 will produce an overall circular symmetric beam profile and reduced sound clutter over the arrays of FIGS. 7 and 8. The enhanced symmetry will result in significant improvement in the ultrasound imaging quality for medical diagnostics, therapeutic applications, and non-destructive testing of materials.

The high density, pixel array of this invention, fabricated by an innovative laser micro-milling method as described above, has the capability of providing a real-time, high performance imager, sensor, transmitter, detector, or the like at relatively low cost. This will allow a small, portable X-ray or ultrasonic imaging system to be carried by emergency personnel for field use, for example at accident scenes or on battlefields, permitting enhanced, immediate diagnostic evaluation. Such a system is also advantageous in the dental field, in order to permit real-time evaluations and adjustments, in addition to cost savings and reduced radiation exposure.

The controlled laser micro-milling method described above has the capability of milling high aspect ratio, narrow kerfs or grooves in highly x-ray sensitive, short life phosphor crystals which were previously considered unsuitable for accurate laser processing, or in piezoelectric crystals or ceramics. Because of the strict control of the energy per unit area per unit time input along each groove in the crystal, it can be ensured that only the minimum amount of energy required to ablate the desired region is put into the crystal, reducing the risk of degradation of the groove walls defining the pixel array. This control is achieved by the constant relative velocity motion of the sample being machined relative to the laser beam, and by control of the laser intensity and pulse width. Since the energy per unit area per unit time is kept relatively adequate, numerous successive passes of the laser along the groove are required in order to micro-machine the entire groove to the desired depth. The highly controlled laser processing results in fabrication of highly smooth pixel walls of high optical quality. Thus, the fabricated pixels in the X-ray detector array serve as light guides for the x-ray induced light, with little or no cross talk between adjacent pixels or escape of light out of each pixel due to the smooth optical finish of the side walls and the reflective and adhesive material filling the grooves. The pixels in the ultrasonic transducer array have similarly straight walls and are highly uniform, producing good, steerable ultrasonic beam forms. The computer controlled micromachining pattering technique also permits curved or circular grooves to be formed, unlike previous mechanical dicing techniques, which can provide only linear grooves. The circular symmetrical 2D transducer array of FIG. 9 will have better ultrasound beam profiles and produce better imaging with higher spatial resolution and lower off-axis acoustic clutter.

Although some exemplary embodiments of the present invention have been described above by way of example only, it will be understood by those skilled in the field that modifications may be made to the disclosed embodiments without departing from the scope of the present invention, which is defined by the appended claims.

We claim:

1. A two dimensional pixel array device, comprising:
a substrate having a first surface and a second surface, the first surface having a series of grooves defining a two dimensional array of micro-milled pixels;
the array having a high pixel density of greater than 100 pixels/cm$^2$ and a fill factor of at least about 60%;
each pixel having an aspect ratio greater than 1:1;
signal connection devices coupled to said second surface of said substrate for input and output of signals to and from said substrate pixels; and
each groove having a width in the range from 4 $\mu$m to 25 $\mu$m.

2. The device as claimed in claim 1, wherein the substrate is of an ultrasonic transducer material.

3. The device as claimed in claim 2, wherein the transducer material is selected from the group consisting of relaxor ferroelectric materials, piezoelectric single crystals, and piezoelectric ceramics.

4. The device as claimed in claim 3, wherein the piezoelectric material is a relaxor ferroelectric material selected from the group consisting of PZN-PT and PMN-PT.

5. The device as claimed in claim 3, wherein the piezoelectric material is a piezoelectric single crystal selected from the group consisting of barium titanate and lithium tantalate.

6. The device as claimed in claim 3, wherein the piezoelectric material is a piezoelectric ceramic comprising a selected composition of lead zirconate titanate (PZT).

7. The device as claimed in claim 2, wherein each pixel has each cross-sectional dimension in the range from 25 $\mu$m to 1000 $\mu$m.

8. The device as claimed in claim 7, wherein each pixel has each cross-sectional dimension no greater than 150 μm.

9. The device as claimed in claim 1, wherein the grooves are arranged in a predetermined, two dimensional computerized pattern of reticulated lines.

10. The device as claimed in claim 9, wherein at least some of the lines are straight.

11. The device as claimed in claim 9, wherein at least some of the lines are curved.

12. The device as claimed in claim 1, wherein the substrate is of circular cross-section and the grooves comprise a series of spaced circular grooves and a series of spaced transverse grooves extending between adjacent pairs of circular grooves to define the individual pixels.

13. The device as claimed in claim 12, wherein the substrate has a diameter of approximately 1 mm.

14. The device as claimed in claim 13, comprising at least 100 pixels of substantially equalized area.

15. The device as claimed in claim 1, wherein each groove has an aspect ratio in the range from 3:1 to 150:1.

16. The device as claimed in claim 1, including an adhesive material substantially filling the grooves between adjacent pixels.

17. The device as claimed in claim 16, wherein the adhesive is a flexible epoxy material.

18. A two dimensional pixel array device, comprising:
a substrate having a first surface and a second surface, the first surface having a series of grooves defining a high density, two dimensional array of micro-milled pixels, the grooves comprising a first set of spaced grooves and a second set of spaced grooves extending at an angle to the first set to define a two dimensional array of pixels;
the pixel density being greater than 100 pixels/cm$^2$ and the array having a fill factor of about 60%;
signal connection devices coupled to the second surface of said substrate for input and output of signals to and from said substrate pixels; and
the substrate being of an ultrasonic transducer material selected from the group consisting of relaxor ferroelectric materials, piezoelectric single crystals, and piezoelectric ceramics.

19. The device as claimed in claim 18, wherein the piezoelectric material is a relaxor ferroelectric material selected from the group consisting of PZN-PT and PMN-PT.

20. The device as claimed in claim 18, wherein the grooves extend completely through the substrate to said second surface, whereby each pixel has a first end at said first surface and a second end at said second surface, and further comprising an electrode mounted at the second end of each pixel, transmitter and receiver electronics connected to the electrodes, and a layer of backing material encasing the second ends of the pixels and the electrodes.

21. The device as claimed in claim 20, including a layer of acoustic matching material extending over the first ends of the pixels.

22. The device as claimed in claim 1, wherein the pixel density is in the range from 100 pixels/cm$^2$ to $1.5 \times 10^5$ pixels/cm$^2$.

23. The device as claimed in claim 22, wherein the pixel density is around 2500 pixels/cm$^2$.

24. The device as claimed in claim 1, wherein the two dimensional array is a matrix of 128×128 pixels.

* * * * *